United States Patent
Lin et al.

(10) Patent No.: US 10,879,172 B2
(45) Date of Patent: Dec. 29, 2020

(54) SEMICONDUCTOR STRUCTURE

(71) Applicant: Taiwan Semiconductor Manufacturing Co., Ltd., Hsinchu (TW)

(72) Inventors: Jiefeng Jeff Lin, Hsinchu (TW); Hsiao-Lan Yang, Taipei (TW); Chih-Yung Lin, Hsinchu County (TW); Chung-Hui Chen, Hsinchu (TW); Hao-Chieh Chan, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 114 days.

(21) Appl. No.: 16/238,645

(22) Filed: Jan. 3, 2019

(65) Prior Publication Data
US 2020/0058580 A1 Feb. 20, 2020

Related U.S. Application Data

(60) Provisional application No. 62/718,550, filed on Aug. 14, 2018.

(51) Int. Cl.
*H01L 23/528* (2006.01)
*H01L 23/522* (2006.01)
*H01L 49/02* (2006.01)

(52) U.S. Cl.
CPC ........ *H01L 23/528* (2013.01); *H01L 23/5223* (2013.01); *H01L 23/5226* (2013.01); *H01L 23/5228* (2013.01); *H01L 28/20* (2013.01); *H01L 28/60* (2013.01)

(58) Field of Classification Search
CPC ..... H01L 28/20; H01L 28/60; H01L 23/5228; H01L 23/5226; H01L 23/5223
See application file for complete search history.

(56) References Cited

U.S. PATENT DOCUMENTS

| | | | | |
|---|---|---|---|---|
| 5,554,873 A | * | 9/1996 | Erdeljac | H01L 21/32155 257/380 |
| 6,365,480 B1 | * | 4/2002 | Huppert | H01L 27/0682 257/E21.006 |
| 6,919,244 B1 | * | 7/2005 | Remmel | H01L 23/5223 257/E21.004 |
| 7,012,499 B2 | * | 3/2006 | Amadon | H01C 7/006 338/7 |

(Continued)

*Primary Examiner* — Earl N Taylor
(74) *Attorney, Agent, or Firm* — McClure, Qualey & Rodack, LLP

(57) ABSTRACT

Semiconductor structures are provided. A semiconductor structure includes a substrate, a conductive plate of a first metal layer over the substrate, a first resistor material of a resistor layer over the conductive plate, a high-K material formed between the first resistor material and the conductive plate, a first conductive line of a second metal layer over the resistor layer, and a first via formed between the first conductive line and the first resistor material. The conductive plate, the first resistor material and the high-K material form a capacitor between the first and second metal layers. The first distance between the first resistor material and the conductive plate is less than the second distance between the first resistor material and the first conductive line.

20 Claims, 6 Drawing Sheets

(56) References Cited

U.S. PATENT DOCUMENTS

| | | | | |
|---|---|---|---|---|
| 7,202,567 | B2* | 4/2007 | Kikuta | H01L 23/5223 |
| | | | | 257/533 |
| 8,124,490 | B2* | 2/2012 | Lin | H01G 4/228 |
| | | | | 257/E21.02 |
| 9,064,719 | B1* | 6/2015 | Zhou | H01L 27/0688 |
| 9,281,355 | B2* | 3/2016 | Dirnecker | H01L 27/016 |
| 9,865,582 | B2* | 1/2018 | Dirnecker | H01L 21/32135 |
| 2013/0302965 | A1* | 11/2013 | Summerfelt | H01L 28/60 |
| | | | | 438/382 |
| 2015/0318340 | A1* | 11/2015 | Dirnecker | H01L 23/5226 |
| | | | | 257/533 |
| 2016/0141283 | A1* | 5/2016 | Dirnecker | H01L 23/5226 |
| | | | | 257/533 |
| 2019/0304905 | A1* | 10/2019 | Wee | H01L 27/0255 |
| 2019/0305074 | A1* | 10/2019 | Kande | H01L 23/5223 |
| 2020/0058580 | A1* | 2/2020 | Lin | H01L 23/5226 |

* cited by examiner

SEMICONDUCTOR STRUCTURE

CROSS REFERENCE TO RELATED APPLICATIONS

This Application claims priority of U.S. Provisional Application No. 62/718,550, filed on Aug. 14, 2018, the entirety of which is incorporated by reference herein.

BACKGROUND

The semiconductor integrated circuit industry has experienced rapid growth over the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1:
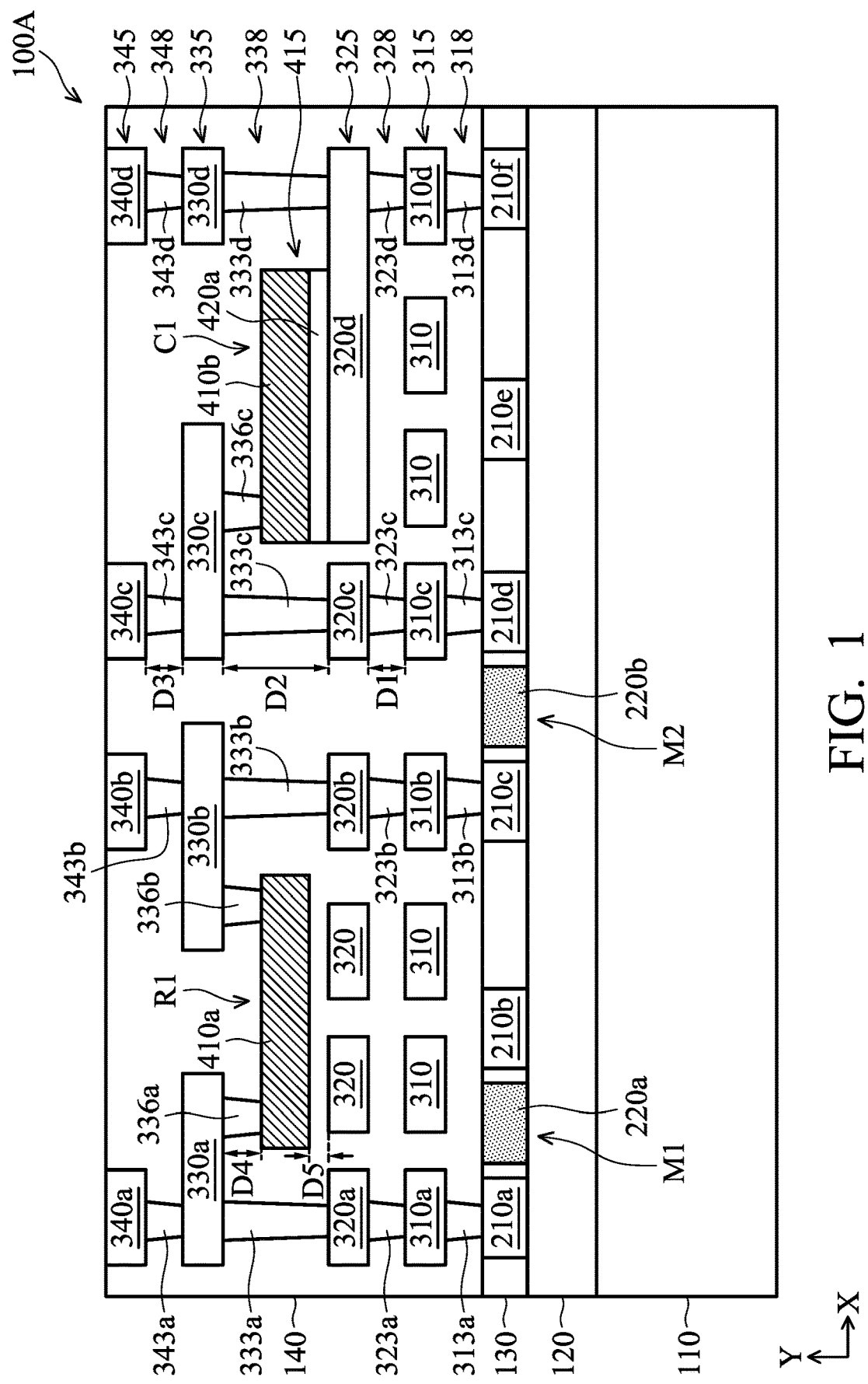
FIG. 1 illustrates a cross-sectional view of a semiconductor structure, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and second nodes are formed in direct contact, and may also include embodiments in which additional nodes may be formed between the first and second nodes, such that the first and second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various semiconductor structures of integrated circuits (ICs) are provided in accordance with various exemplary embodiments. Some variations of some embodiments are discussed. Throughout the various views and illustrative embodiments, like reference numbers are used to designate like elements.

The IC fabrication process can divided into three modules, in which each module may include all or some of the following operations: patterning (e.g., photolithography and etch); implantation; metal and dielectric material deposition; wet or dry clean; and planarization (e.g., etch-back process or chemical mechanical planarization). The three modules can be categorized as front end of the line (FEOL), middle of the line (MOL)/middle end of the line (MEOL), and back end of the line (BEOL).

In FEOL, various transistors are formed. For example, FEOL includes the formation of source/drain regions, a gate structure, and spacers on sides of the gate structure. The source/drain regions can be doped substrate regions formed with an implantation process after the gate structure formation. The gate structure includes a metal gate electrode, which can include two or more metal layers. The gate dielectric can include a high dielectric constant (high-k) material (e.g., greater than 3.9, which is the dielectric constant of silicon oxide). The metals in the gate electrode set the work function of the gate, in which the work functions can be different between P-type transistors and N-type transistors. The gate dielectric provides electrical isolation between the metal gate electrode and a channel formed between the source and the drain regions when the transistor is in operation.

In MEOL, low level interconnects (contacts) are formed and may include two layers of contacts on top of each other. The MEOL interconnects can have smaller critical dimensions (CDs; e.g., line width) and are spaced closer together compared to their BEOL counterparts. A purpose of the MEOL contact layers is to electrically connect the various regions of the transistors, i.e., the source/drain and metal gate electrode, to higher level interconnects in BEOL. A first layer of contacts in MEOL, known as "trench silicide (TS)" or "trench contacts (TC)," are formed over the source and drain regions on either side of the gate structure. In the TS, or TC, configuration, the silicide is formed in the trench and after the trench formation. The silicide lowers the resistance between the source and drain regions and the metal contacts. The gate structure and the first layer of contacts are considered to be on the same "level." The second layer of contacts are formed over the gate electrode and TS. MEOL contacts are embedded in a dielectric material, or a dielectric stack of materials, that ensures their electrical isolation.

In BEOL, an interlayer dielectric (ILD) layer is deposited over the MEOL contacts. The formation of high level interconnects in BEOL involves patterning a hard mask (HM) layer and subsequently etching through the HM layer to form holes and trenches in the ILD layer. The ILD layer can be a low-k material. Low-k materials can have a dielectric constant below 3.9, which is the dielectric constant of silicon oxide ($SiO_2$). Low-k materials in BEOL can reduce unwanted parasitic capacitance and minimize resistance-capacitance (RC) delays. BEOL interconnects include two types of conductive lines: the vertical interconnect access lines (vias) and the lateral lines (lines). The vias run through the ILD layer in the vertical direction and create electrical connections to layers above or below the ILD layer. Lines are laid in the lateral direction within the ILD layer to connect a variety of components within the same ILD layer. An interconnect layer can have one or more vias and one or more lines. BEOL may include multiple interconnect layers (e.g., up to 9 or more) with vias and lines of increasing CD size (e.g., line width) and line pitch. Each interconnect layer is required to align to the previous interconnect layer to ensure proper via and line connectivity.

The dielectric layer used in the MEOL processes usually possesses a higher dielectric constant than that of the intermetal dielectric (IMD) layers which is used in the BEOL processes. Furthermore, the characteristics of the MEOL and FEOL processes provide a smaller spacing interval between elements, as compared to the BEOL processes.

FIG. 1 illustrates a cross-sectional view of a semiconductor structure 100A, in accordance with some embodiments of the disclosure. A semiconductor substrate 110 is provided. In some embodiments, at least one well region 120 is formed over the semiconductor substrate 110. The well region 120 may be a P-type well region or a N-type well region. In some embodiments, the semiconductor substrate 110 is a Si substrate. In some embodiments, the material of the semiconductor substrate 110 is selected from a group consisting of bulk-Si, SiP, SiGe, SiC, SiPC, Ge, SOI-Si, SOI-SiGe, III-VI material, or a combination thereof.

In some embodiments, various diffusion regions (not shown) are formed in the well region 120. The diffusion region may be a P-type doping region or an N-type doping region. Furthermore, an isolation structure (not shown) may be used to separate the diffusion region from other diffusion regions. In some embodiments, the isolation structure is a shallow trench isolation (STI) structure.

An inter-Layer Dielectric (ILD) layer 130 is formed over the well region 120. The ILD layer 130 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like.

The semiconductor substrate 110 may have various device elements. Examples of device elements that are formed in the semiconductor substrate 110 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

The contacts 210a through 210f are formed in the ILD layer 130. Furthermore, the gate structures 220a and 220b are formed in the ILD layer 130. In some embodiments, the gate structure 220a is a gate structure of a transistor M1, and the contacts 210a and 210b are coupled to source and drain regions of the transistor M1 formed by the diffusion regions. Furthermore, the gate structure 220b is a gate structure of a transistor M2, and the contacts 210c and 210d are coupled to source and drain regions of the transistor M2.

In some embodiments, the contacts 210a through 210f include a metal plug made of the same material. In some embodiments, the material of the metal plug is selected from a group consisting of aluminum, copper, tungsten, titanium, tantulum, titanium nitride, tantalum nitride, nickel silicide, cobalt silicide, TaC, TaSiN, TaCN, TiAl, TiAlN, or other applicable conductive materials. Furthermore, the contacts 210a through 210f may be formed by sputtering, electroless plating, chemical vapor deposition (CVD), physical vapor deposition (PVD), or atomic layer deposition (ALD).

In some embodiments, the well region 120 is P-type well region, and the transistors M1 and M2 are NMOS transistors. In some embodiments, the well region 120 is N-type well region, and the transistors M1 and M2 are PMOS transistors.

In some embodiments, the transistors M1 and M2 are planar MOS devices. In some embodiments, the transistors M1 and M2 are fin field effect transistors (FinFETs). In order to simplify the description, the active regions, the channels or the fins of the transistors M1 and M2 are omitted.

The gate structures 220a and 220b may include gate dielectric layers (not shown) and gate electrodes. In some embodiments, gate dielectric layers are made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, and other applicable dielectric materials.

In some embodiments, the gate structures 220a and 220b may be formed over gate dielectric layers. In some embodiments, gate electrodes are made of conductive materials, such as polysilicon, metal, metal alloy, and/or metal silicide. In some embodiments, gate electrodes are made of aluminum, tungsten, cobalt, tantalum, titanium aluminum, copper, or doped polysilicon.

In some embodiments, the gate structures 220a and 220b may be formed by a procedure that includes deposition, photolithography patterning, and etching processes. The deposition processes may include chemical vapor deposition (CVD), physical vapor deposition (PVD), atomic layer deposition (ALD), high-density plasma CVD (HDPCVD), metal organic CVD (MOCVD), or plasma-enhanced CVD (PECVD). The photolithography patterning processes may include photoresist coating (e.g. spin-on coating), soft baking, mask aligning, exposure, post-exposure baking, developing the photoresist, rinsing, drying (e.g. hard baking), and/or other applicable processes. The etching processes may include dry etching, wet etching, and/or other etching methods (e.g. reactive ion etching).

The gate structures 220a and 220b are surrounded by the ILD layer 130. In some embodiments, the ILD layer 130 includes multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. Inter-layer dielectric layer 130 may be formed by CVD, PVD, ALD, spin-on coating, and/or other applicable processes.

After the gate structures 220a and 220b and the contacts 210a through 210f are formed over substrate 110, an interconnect structure is formed to electrically connect with gate structures 220a and 220b and contacts 210a-210f. The interconnect structure is formed in inter-metal dielectric (IMD) layer 140. The IMD layer 140 is formed over the ILD layer 130. In order to simplify the description, the interconnects of the gate structures 220a and 220b are omitted.

In some embodiments, the IMD layer 140 includes multilayers made of multiple dielectric materials, such as a low dielectric constant or an extreme low dielectric constant (ELK) material. Examples of the dielectric materials may include, but are not limited to, oxide, SiO2, borophosphosilicate glass (BPSG), tetraethyl orthosilicate (TEOS), spin on glass (SOG), undoped silicate glass (USG), fluorinated silicate glass (FSG), high-density plasma (HDP) oxide, or plasma-enhanced TEOS (PETEOS).

More specifically, a first level via layer 318 is formed over the ILD 130. The first level via layer 318 includes first level vias 313a through 313d formed in the IMD 140. In addition, the first level vias 313a through 313d has a first via height, which is measured along a Y-direction.

In some embodiments, the first level vias 313a through 313d are made of a highly-conductive metal, low-resistive metal, elemental metal, transition metal, or the like. Examples of conductive materials used to form the first level vias 313a through 313d may include, but are not limited to, copper (Cu), aluminum (Al), tungsten (W), titanium (Ti), gold (Au), cobalt (Co), and tantalum (Ta).

In some embodiments, each of the first level vias 313a through 313d includes a metal plug made of the same material. In some embodiments, the material of the metal plug is purely W (Tungsten) or purely Ru (Ruthenium). In some embodiments, the material of the metal plug is selected from a group consisting of Ti, TiN, TaN, Co, Ru, Pt, W, Al, Cu, or a combination thereof.

As shown in FIG. 1, the first level via 313a is in direct contact with the contact 210a. The first level via 313b is in direct contact with the contact 210c. The first level via 313c is in direct contact with the contact 210d. Furthermore, the first level via 313d is in direct contact with the contact 210f.

After the first level via layer 318 is formed, a first level metal layer 315 is formed over the first level via layer 318. The first level metal layer 315 includes first level conductive (or metal) lines 310, and 310a through 310d formed in the IMD 140. In some embodiments, first level metal lines 310 are made of a highly-conductive metal, low-resistive metal, elemental metal, transition metal, or the like. Examples of conductive materials used to form first level metal lines 310 may include, but are not limited to, copper (Cu), aluminum (Al), tungsten (W), titanium (Ti), gold (Au), cobalt (Co), or tantalum (Ta). In addition, the first level conductive lines 310 has a first metal thickness, which is measured along a Y-direction.

As shown in FIG. 1, the first level conductive line 310a is in direct contact with the first level via 313a. The first level conductive line 310b is in direct contact with the first level via 313b. The first level conductive line 310c is in direct contact with the first level via 313c. Furthermore, the first level conductive line 310d is in direct contact with the first level via 313d.

After the first level metal layer 315 is formed, a second level via layer 328 is formed over the first level metal layer 315. The second level via layer 328 includes second level vias 323a through 323d formed in the IMD 140. In addition, the second level vias 323a through 323d has a second via height, which is measured along a Y-direction. In some embodiments, the second via height of the second level vias 323a through 323d is identical to or different from the first via height of the first level vias 313a through 313d. Furthermore, materials used to form the second level vias 323a through 323d may be the same as, or similar to, those used to form the first level vias 313a through 313d and is not repeated herein.

As shown in FIG. 1, the second level via 323a is in direct contact with the first level conductive line 310a. The second level via 323b is in direct contact with the first level conductive line 310b. The second level via 323c is in direct contact with the first level conductive line 310c. Furthermore, the second level via 323d is in direct contact with the first level conductive line 310d.

After the second level via layer 328 is formed, a second level metal layer 325 is formed over the second level via layer 328. The second level metal layer 325 includes second level conductive (or metal) lines 320, and 320a through 320d formed in the IMD 140. In addition, the second level conductive lines 320 has a second metal thickness, which is measured along a Y-direction. In some embodiments, the second metal thickness of the second level conductive lines 320 is identical to the first metal thickness of the first level conductive lines 310. Furthermore, materials used to form the second level conductive lines 320 may be the same as, or similar to, those used to form the first level conductive lines 310 and is not repeated herein.

As shown in FIG. 1, the second level conductive line 320a is in direct contact with the second level via 323a. The second level conductive line 320b is in direct contact with the second level via 323b. The second level conductive line 320c is in direct contact with the second level via 323c. Furthermore, the second level conductive line 320d is in direct contact with the second level via 323d.

A third level via layer 338 is formed over the second level metal layer 325. The third level via layer 338 includes third level vias 333a through 333d and third level vias 336a through 336c formed in the IMD 140. In addition, the third level vias 333a through 333d has a third via height, which are measured along a Y-direction. The third level vias 336a through 336c has a fourth via height, which are measured along a Y-direction. It should be noted that the third via height is greater than the fourth via height. In some embodiments, the second via height of the second level vias 323a through 323d and/or the first via height of the first level vias 313a through 313d are different from the third via height of the third level vias 333a through 333d. Similarly, the second via height of the second level vias 323a through 323d and/or the first via height of the first level vias 313a through 313d are different from the fourth via height of the third level vias 336a through 336c. Furthermore, materials used to form the third level vias 333a through 333d and the third level vias 336a through 336c may be the same as, or similar to, those used to form the first level vias 313a through 313d and is not repeated herein.

Before the third level vias 336a through 336c are formed, a resistor layer 415 is formed over the second level metal layer 325. The resistor layer 415 includes first resistor material 410a and second resistor material 410b formed in the IMD 140. In some embodiments, the resistor layer 415 is a high-precision resistor layer, and the first resistor material 410a and the second resistor material 410b have a low temperature coefficient of resistance (TCR) while also having a high resistance (e.g., a high sheet resistance). For example, the first resistor material 410a and the second resistor material 410b are made of the P-type polysilicon or titanium nitride, that is the material suitable for a high precision resistor having a smallest temperature coefficient among silicon resistors. In some embodiments, extra film deposition (either polysilicon or SiCR) and extra masks are used to decrease TCR and maintain high resistance.

TCR is a measurement of the effect a change in temperature has on the resistance of a structure (or a material). A TCR of greater than 0 indicates that the resistance of the structure increases as the structure's temperature is increased. A TCR of less than 0 indicates that the resistance of the structure decreases as the structure's temperature is increased. The magnitude of a TCR value is the distance of the value from 0. A resistance of a structure with a TCR closer to 0 will not vary as much with temperature changes as the resistance of a structure with a TCR further away from 0.

Before the second resistor material 410b is formed in the resistor layer 415, a high-K material 420a is formed over the second level conductive line 320d. In some embodiments, the high-K material 420a is a high dielectric constant (high-k) material (e.g., greater than 3.9, which is the dielectric constant of silicon oxide).

In some embodiments, the material of the high-K material 420a is selected from a group consisting of a nitride-based dielectric, a metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), or a combination thereof.

In some embodiments, the material of the high-K material 420a is selected from a group consisting of SiON, $Ta_2O_5$, $Al_2O_3$, a nitrogen-content oxide layer, nitrided oxide, a metal oxide dielectric, Hf-content oxide, Ta-content oxide, Ti-content oxide, Zr-content oxide, Al-content oxide, La-content oxide, or a combination thereof.

In such embodiments, compared with the second level conductive lines 320a through 320c in the second level metal layer 325, the second level conductive line 320d has a larger area to form a second level conductive plate 320d.

The second resistor material 410b, the high-K material 420a and the second level conductive plate 320d form a metal-insulator-metal (MIM) capacitor C1. The MIM capacitor C1 is one type of capacitors, that can be used in mixed signal devices and logic devices, such as embedded memories and radio frequency devices. The MIM capacitor C1 may be used to store a charge in a variety of semiconductor devices. Furthermore, the MIM capacitor C1 is formed horizontally on the semiconductor structure 100A in a semiconductor wafer.

As shown in FIG. 1, the second level conductive plate 320d forms a bottom electrode of the MIM capacitor C1, and the bottom electrode of the MIM capacitor C1 is in direct contact with the third level via 333d and the second level via 323d. Furthermore, the second resistor material 410b forms a top electrode of the MIM capacitor C1, and the top electrode of the MIM capacitor C1 is in direct contact with the third level via 336c. Specifically, the top and bottom electrodes of the MIM capacitor C1 are in direct contact with the third level vias having different via heights (e.g., the third via height of the third level via 333d and the fourth via height of the third level via 336c). Moreover, the high-K material 420a forms a dielectric layer sandwiched in between the top electrode and the bottom electrode of the MIM capacitor C1. Furthermore, for the MIM capacitor C1, the top electrode, the bottom electrode and the dielectric layer are parallel to the surface of the semiconductor wafer. It will be appreciated that the thickness of the dielectric layer varies depending on the dielectric material and the desired capacitance of the MIM capacitor C1. Furthermore, a capacitance of the MIM capacitor C1 is determined according to an overlapping area of the second resistor material 410b and the second level conductive plate 320d.

In some embodiments, the second level conductive plate 320d may be any of a variety of materials; specifically, materials of the second level conductive plate 320d may include Pt, AlCu, TiN, Au, Ti, Ta, TaN, W, WN, and Cu.

In some embodiments, the conductive lines and/or conductive plates in each level metal layer are made of conductive materials such as metals, certain metal nitrides, and silicide metal nitrides in the semiconductor structure 100A.

As shown in FIG. 1, a first terminal of the MIM capacitor C1 is electrically connected to the source/drain region of the transistor M2 through the third level via 336c, the third level conductive line 330c, the third level via 333c, the second level conductive line 320c, the second level via 323c, the first level conductive line 310c, the first level via 313c and the contact 210d in sequence. Simultaneously, the first terminal of the MIM capacitor C1 is electrically connected to other circuit or device (not shown) through the fourth level via 343c, and the fourth level conductive line 340c. Furthermore, a second terminal of the MIM capacitor C1 is electrically connected to the contact 210f through the second level via 323d, the first level conductive line 310d, and the first level via 313d in sequence. Simultaneously, the second terminal of the MIM capacitor C1 is electrically connected to other circuit or device (not shown) through the fourth level via 343d, and the fourth level conductive line 340d.

Figure 2A:
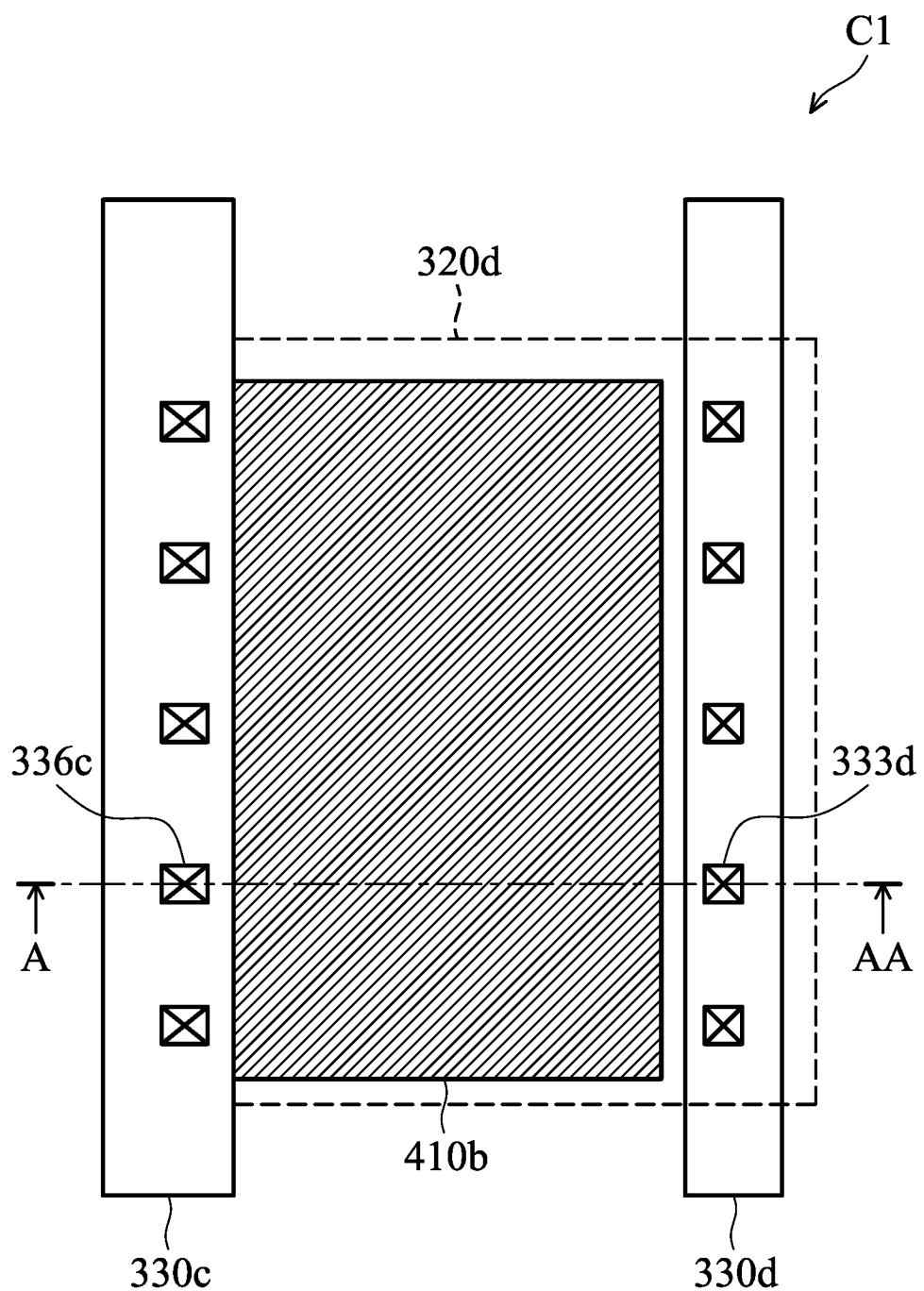
FIG. 2A illustrates a layout view of the MIM capacitor of FIG. 1, in accordance with some embodiments of the disclosure.

In some embodiments, a layout view of the MIM capacitor C1 of FIG. 1 is illustrated in FIG. 2A, in accordance with some embodiments of the disclosure. Furthermore, the cross-sectional view of the MIM capacitor C1 in the semiconductor structure 100A is obtained along line A-AA of FIG. 2A.

Referring back to FIG. 1, the first resistor material 410a forms a resistor R1 in the resistor layer 415. A first terminal of the resistor R1 is in direct contact with the third level via 336a, and a second terminal of the resistor R1 is in direct contact with the third level via 336b. Specifically, the first and second terminals of the resistor R1 are in direct contact with the third level vias having the same via height (e.g., the third via height of the third level vias 336a and 336b).

As shown in FIG. 1, the first terminal of the resistor R1 is electrically connected to the source/drain region of the transistor M1 through the third level via 336a, the third level conductive line 330a, the third level via 333a, the second level conductive line 320a, the second level via 323a, the first level conductive line 310a, the first level via 313a and the contact 210a in sequence. Simultaneously, the first terminal of the resistor R1 is electrically connected to other circuits or devices (not shown) through the fourth level via 343a, and the fourth level conductive line 340a. Furthermore, the second terminal of the resistor R1 is electrically connected to the source/drain region of the transistor M2 through the third level via 336b, the third level conductive line 330b, the third level via 333b, the second level conductive line 320b, the second level via 323b, the first level conductive line 310b, the first level via 313b and the contact 210c in sequence. Simultaneously, the second terminal of the resistor R1 is electrically connected to other circuit or device (not shown) through the fourth level via 343b, and the fourth level conductive line 340b.

Figure 2B:
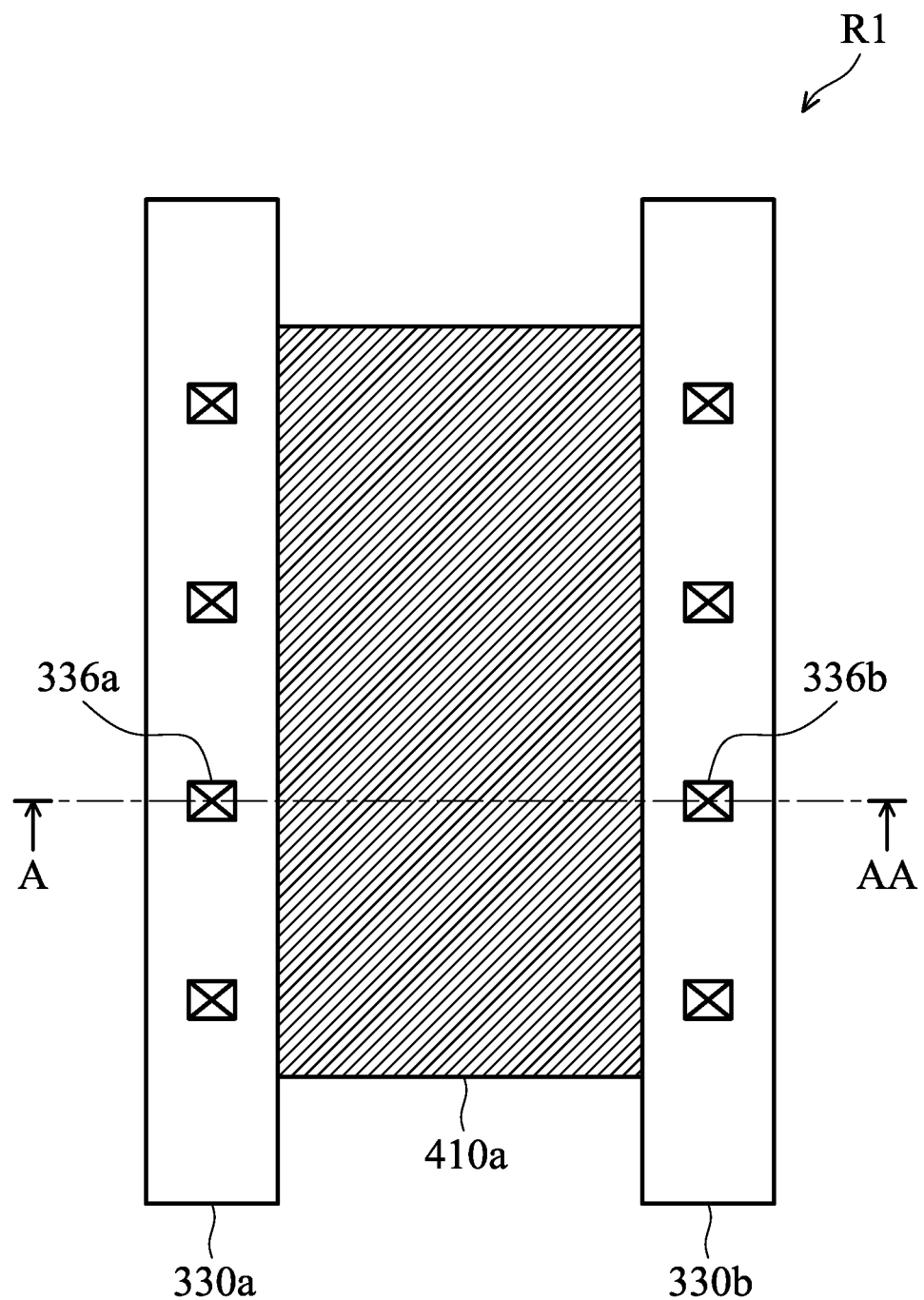
FIG. 2B illustrates a layout view of the resistor of FIG. 1, in accordance with some embodiments of the disclosure.

In some embodiments, a top view of the resistor R1 of FIG. 1 is illustrated in FIG. 2B, in accordance with some embodiments of the disclosure. Furthermore, the cross-sectional view of the resistor R1 in the semiconductor structure 100A is obtained along line A-AA of FIG. 2B.

Referring back to FIG. 1, after the third level via layer 338 is formed, a third level metal layer 335 is formed over the third level via layer 338. The third level metal layer 335 includes third level conductive (or metal) lines 330a through 330d formed in the IMD 140. In addition, the third level conductive lines 330a through 330d has a third metal thickness, which is measured along a Y-direction. In some embodiments, the third metal thickness of the third level conductive lines 330a through 330d is identical to the first metal thickness of the first level conductive lines 310 and/or the second metal thickness of the second level conductive lines 320. Furthermore, materials used to form the third level conductive lines 330a through 330d may be the same as, or similar to, those used to form the first level conductive lines 310 and is not repeated herein.

A fourth level via layer 348 is formed over the third level metal layer 335. The fourth level via layer 348 includes fourth level vias 343a through 343d in the IMD 140. In addition, the fourth level vias 343a through 343d have a fifth via height, which are measured along a Y-direction. In some embodiments, the second via height of the second level vias 323a through 323d and/or the first via height of the first level vias 313a through 313d are identical to the fifth via height of the fourth level vias 343a through 343d. Furthermore, materials used to form the fourth level vias 343a through 343d may be the same as, or similar to, those used to form the first level vias 313a through 313d and is not repeated herein.

After the fourth level via layer 348 is formed, a fourth level metal layer 345 is formed over the fourth level via layer 348. The fourth level metal layer 345 includes fourth level conductive (or metal) lines 340a through 340d formed in the IMD 140. In addition, the fourth level conductive lines 340a through 340d has a fourth metal thickness, which is measured along a Y-direction. In some embodiments, the fourth metal thickness of the fourth level conductive lines 340a through 340d is identical to the first metal thickness of the first level conductive lines 310, the second metal thickness of the second level conductive lines 320, and/or the third metal thickness of the third level conductive lines 330a through 330d. Furthermore, materials used to form the fourth level conductive lines 340a through 340d may be the same as, or similar to, those used to form the first level conductive lines 310 and is not repeated herein.

In FIG. 1, by using an additional mask to form the resistor layer 415, the resistor R1 and the MIM capacitor C1 are simultaneously formed between the second level metal layer 325 and the third level metal layer 335. A distance D2 between the second level metal layer 325 and the third level metal layer 335 is greater than a distance D1 between the first level metal layer 315 and the second level metal layer 325 and a distance D3 between the third level metal layer 335 and the fourth level metal layer 345, i.e., D2>D1 and D2>D3. In some embodiments, the distance D1 is equal to the distance D3. In some embodiments, the distances D1, D2 and D3 are the same.

A distance D4 between the third level metal layer 335 and the resistor layer 415 is greater than a distance D5 between the second level metal layer 325 and the resistor layer 415 for capacitor characteristic (e.g., better capacitance density, or less parasitic capacitance). In some embodiments, the distance D5 is equal to the thickness of the high-K material. It should be noted that the resistor layer 415 is disposed closer to the second level metal layer 325 rather than the middle of the second level metal layer 325 and the third level metal layer 335.

For a traditional resistor that is formed in MEOL (e.g., in the lower or lowest metal layer), a non-negligible parasitic capacitance between the resistor and the semiconductor substrate under the traditional resistor is undesired. Thus, an additional N-type well and/or a the shallow trench isolation (STI) is arranged under the traditional resistor, so as to reduce the unwanted parasitic capacitance. Compared with the traditional resistor, by forming the resistor R1 in BEOL (e.g., in the higher metal layer), the unwanted parasitic capacitance is decreased for the resistor R1, and no additional N-type well and/or STI are needed.

For a traditional capacitor between the top metal layers with thin high-k dielectrics, two additional masks are used to form the traditional capacitor for better capacitance density. Compared with the traditional capacitor, by forming the MIM capacitor C1 in the middle metal layer, only one addition mask is used to form the resistor layer 415, thus decreasing manufacturing cost.

Figure 3:
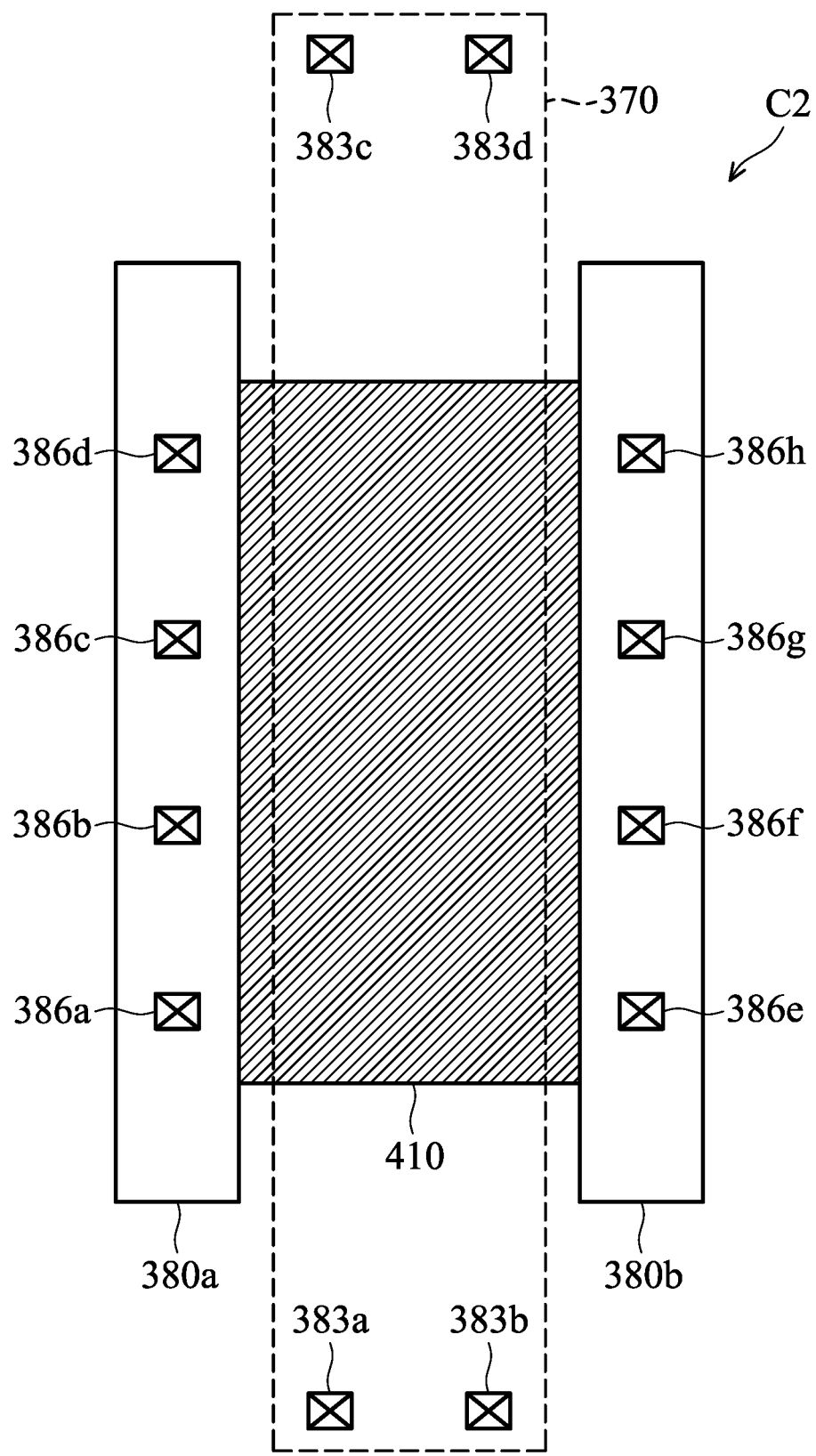
FIG. 3 illustrates a layout of a capacitor, in accordance with some embodiments of the disclosure.

FIG. 3 illustrates the layout of a MIM capacitor C2, in accordance with some embodiments of the disclosure. In the MIM capacitor C2, the left side of a resistor material 410 is in direct contact with the conductive line 380a through the vias 386a through 386d. In some embodiments, the second resistor material 410b have a low temperature coefficient of resistance while also having a high resistance. Furthermore, the right side of the resistor material 410 is also in direct contact with the conductive line 380b through the vias 386e through 386h. The conductive lines 380a and 380b are formed in the same level metal layer over the resistor material 410. The conductive lines 380a and 380b are coupled to each other through other conductive lines of the same level metal layer or other interconnection over or under the same level metal layer. A conductive plate 370 is formed below the resistor material 410, and the conductive plate 370 is coupled to other interconnection over or under the conductive plate 370 through the vias 383a through 383d. Similarly, a high-K material (not shown) is formed between the conductive plate 370 and the resistor material 410. It will be appreciated that the thickness of the dielectric layer varies depending on the dielectric material and the desired capacitance of the MIM capacitor C2. Furthermore, a capacitance of the MIM capacitor C2 is determined according to an overlapping area of the conductive plate 370 and the resistor material 410.

Figure 4:
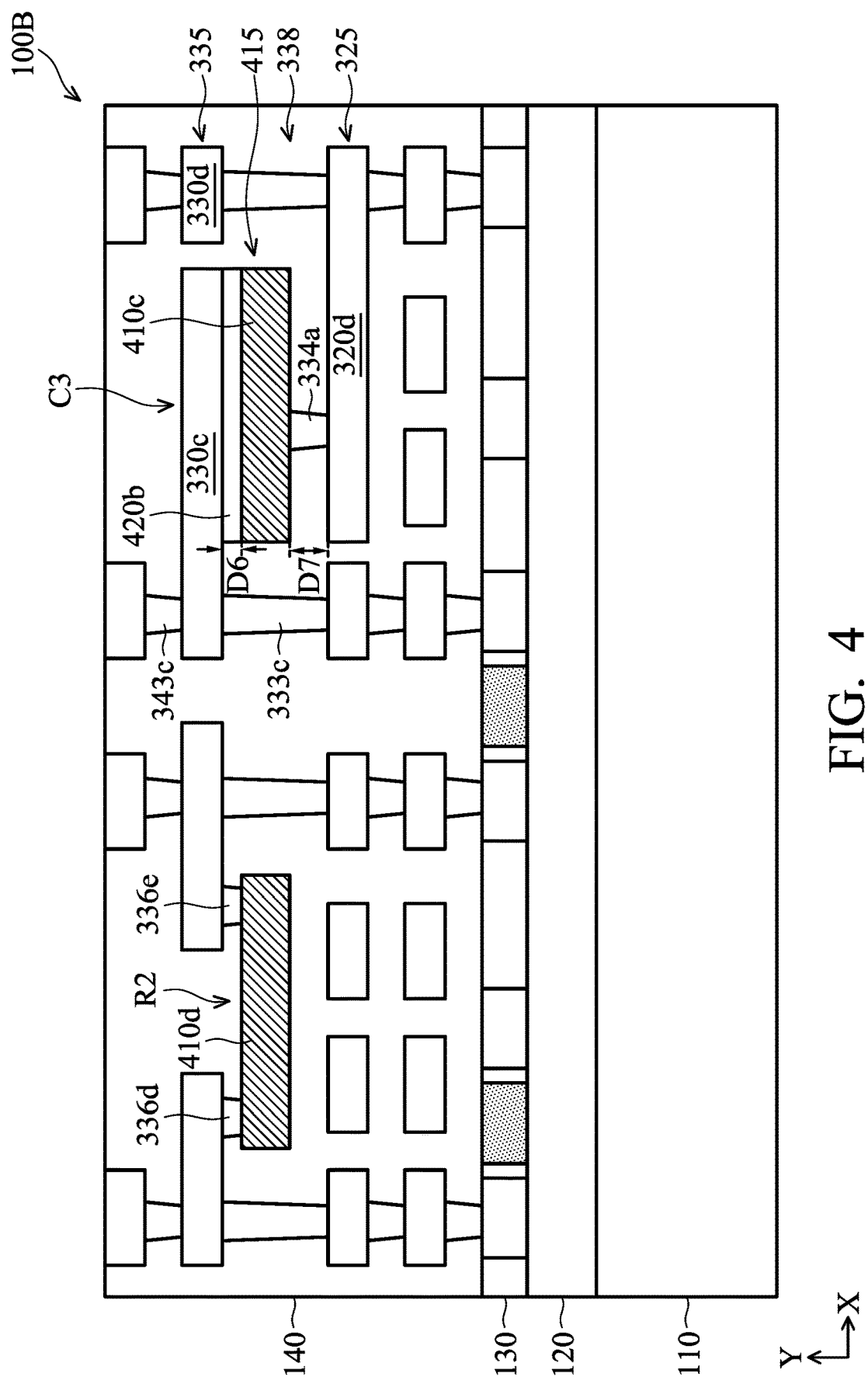
FIG. 4 illustrates a cross-sectional view of a semiconductor structure, in accordance with some embodiments of the disclosure.

FIG. 4 illustrates a cross-sectional view of a semiconductor structure 100B, in accordance with some embodiments of the disclosure. In the semiconductor structure 100B, a resistor R2 and a MIM capacitor C3 are formed between the second level metal layer 325 and the third level metal layer 335. Compared with the MIM capacitor C1 of FIG. 1, the MIM capacitor C3 of FIG. 4 is formed by the third resistor material 410c, the high-K material 420b and the third level conductive line 330c. In such embodiments, compared with the third level conductive lines 320a, 320b and 320d in the third level metal layer 335, the third level conductive line 330c has a larger area to form a third level conductive plate 330c.

As shown in FIG. 4, the third level conductive plate 330c forms a top electrode of the MIM capacitor C3, and the top electrode of the MIM capacitor C3 is in direct contact with the third level via 333c and the fourth level via 343c. Furthermore, the second resistor material 410c forms a bottom electrode of the MIM capacitor C3, and the bottom electrode of the MIM capacitor C3 is in direct contact with the third level via 334a. Specifically, the top and bottom electrodes of the MIM capacitor C3 are in direct contact with the third level vias having different via heights. Moreover, the high-K material 420b forms a dielectric layer sandwiched in between the top electrode and the bottom electrode of the MIM capacitor C3. It will be appreciated that the thickness of the dielectric layer varies depending on the dielectric material and the desired capacitance of the MIM capacitor C3. Furthermore, a capacitance of the MIM capacitor C3 is determined according to an overlapping area of the second resistor material 410c and the third level conductive plate 330c.

A distance D6 between the third level metal layer 335 and the resistor layer 415 is less than a distance D7 between the second level metal layer 325 and the resistor layer 415 for capacitor characteristic (e.g., better capacitance density, or less parasitic capacitance). In some embodiments, the distance D6 is equal to the thickness of the high-K material. It should be noted that the resistor layer 415 is disposed closer to the third level metal layer 335 rather than the middle of the second level metal layer 325 and the third level metal layer 335.

As shown in FIG. 4, the first resistor material 410d forms the resistor R2 in the resistor layer 415. A first terminal of the resistor R2 is in direct contact with the third level via 336d, and a second terminal of the resistor R2 is in direct contact with the third level via 336e. Specifically, the first and second terminals of the resistor R2 are in direct contact with the third level vias having the same via height that is equal to the distance D6. Compared with the third level vias 336a and 336b coupled to the resistor R1 of FIG. 1, the third level vias 336d and 336e coupled to the resistor R2 of FIG. 4 have a lower via height, i.e., distance D6 is shorter than distance D4 (e.g., D6<D4).

Figure 5:
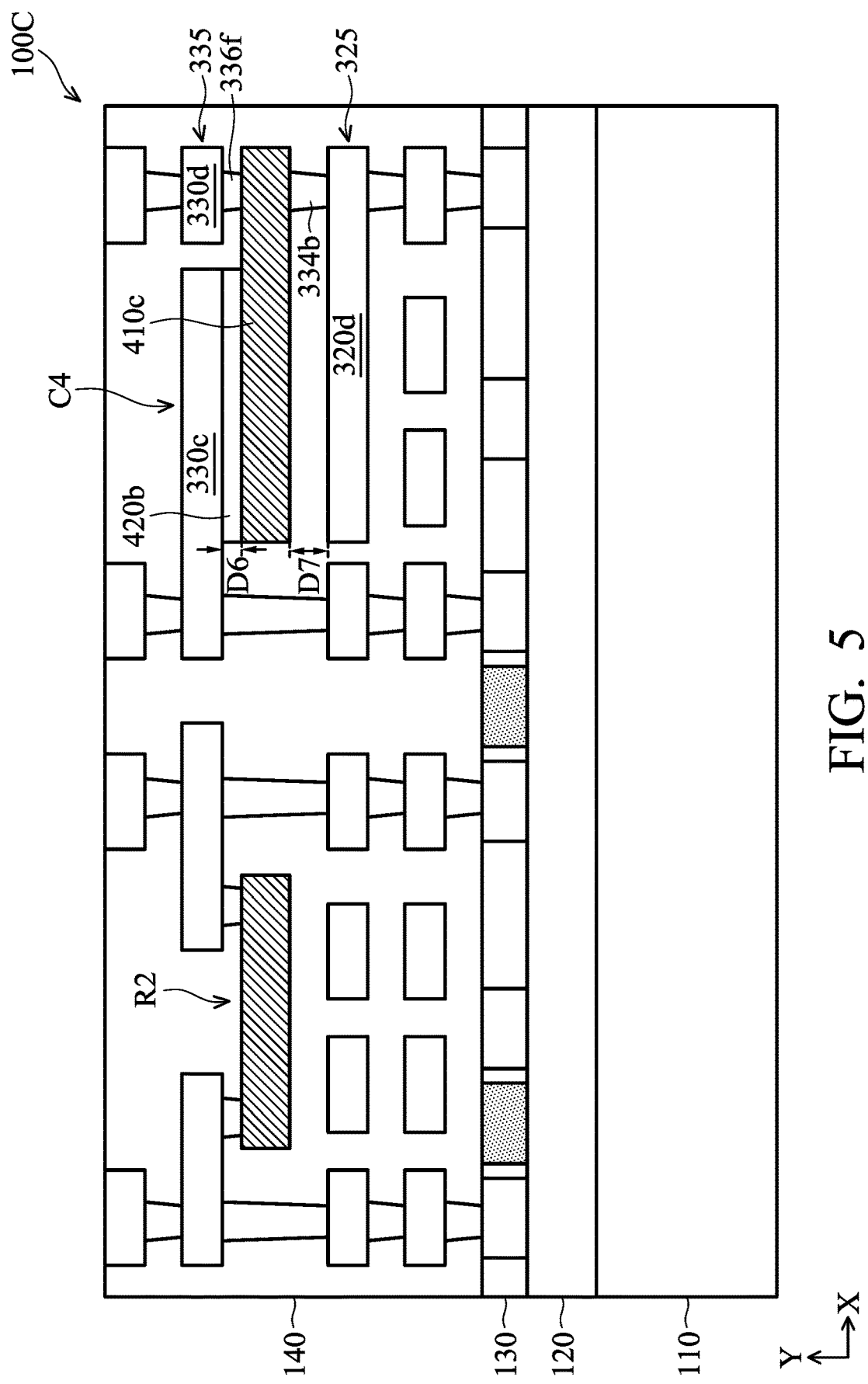
FIG. 5 illustrates a cross-sectional view of a semiconductor structure, in accordance with some embodiments of the disclosure.

FIG. 5 illustrates a cross-sectional view of a semiconductor structure 100C, in accordance with some embodiments of the disclosure. In the semiconductor structure 100B, the resistor R2 and a MIM capacitor C4 are formed between the second level metal layer 325 and the third level metal layer 335. Similar to the MIM capacitor C3 of FIG. 4, the MIM capacitor C4 of FIG. 5 is formed by the third resistor material 410c, the high-K material 420b and the third level conductive line 330c.

As shown in FIG. 5, the third level conductive plate 330c forms a top electrode of the MIM capacitor C4, and the top electrode of the MIM capacitor C4 is in direct contact with the third level via 333c and the fourth level via 343c. Furthermore, the second resistor material 410c forms a bottom electrode of the MIM capacitor C4, and the bottom electrode of the MIM capacitor C4 is in direct contact with the third level via 334b and the third level via 336f. Moreover, the high-K material 420b forms a dielectric layer sandwiched in between the top electrode and the bottom electrode of the MIM capacitor C4. Compared with the capacitor C3 of FIG. 4, the bottom electrode of the MIM capacitor C4 is configured to be electrically connected to the third level conductive line 330d through the third level via 336f and to the second level conductive line 320d through the third level via 334b. Similarly, the capacitance of the MIM capacitor C4 is determined according to an overlapping area of the second resistor material 410c and the third level conductive plate 330c.

Embodiments for semiconductor structures are provided. By using an addition mask to form a resistor layer in the IMD layer, a resistor and a MIM capacitor are formed in two adjacent metal layers in BEOL. The unwanted parasitic capacitance is decreased for the resistor in BEOL, and no additional N-type well and/or STI are needed. Furthermore, the resistor layer is disposed close to a metal layer in the IMD. The resistor material of the resistor layer forms a first electrode of the MIM capacitor, and a metal plate of the metal layer close to the resistor layer forms a second electrode of the MIM capacitor. Furthermore, a high-K material is formed between the first and second electrodes of the MIM capacitor. By using the resistor layer, a resistor and a MIM capacitor are integrated into BEOL process flow with only one additional mask.

In some embodiments, a semiconductor structure is provided. The semiconductor structure includes a substrate, a conductive plate of a first metal layer over the substrate, a first resistor material of a resistor layer over the conductive plate, a high-K material formed between the first resistor material and the conductive plate, a first conductive line of a second metal layer over the resistor layer, and a first via formed between the first conductive line and the first resistor material. The conductive plate, the first resistor material and the high-K material form a capacitor between the first and second metal layers. The first distance between the first resistor material and the conductive plate is less than the second distance between the first resistor material and the first conductive line.

In some embodiments, a semiconductor structure is provided. The semiconductor structure includes a substrate, a first metal layer over the substrate, a second metal layer over the first metal layer, a resistor between the first and second metal layers, and a capacitor. The resistor includes a first resistor material of a resistor layer. The capacitor includes a first electrode plate formed by a metal plate of the first metal layer, a high-K material over the first electrode plate, a second electrode plate over the high-K material and formed by a second resistor material of the resistor layer.

In some embodiments, a semiconductor structure is provided. The semiconductor structure includes a substrate, a first metal layer over the substrate, a second metal layer over the first metal layer, a resistor between the first and second metal layers, and a capacitor. The resistor includes a first resistor material of a resistor layer. The capacitor includes a first electrode plate formed by a metal plate of the second metal layer, a high-K material under the first electrode plate, and a second electrode plate under the high-K material and formed by a second resistor material of the resistor layer.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a substrate;
a conductive plate of a first metal layer over the substrate;

a first resistor material of a resistor layer over the conductive plate;
a high-K material formed between the first resistor material and the conductive plate;
a first conductive line of a second metal layer over the resistor layer; and
a first via formed between the first conductive line and the first resistor material;
a third metal layer over the second metal layer, wherein a distance between the second and third metal layers is less than a distance between the first and second metal layers,
wherein the conductive plate, the first resistor material and the high-K material form a capacitor between the first and second metal layers,
wherein a first distance between the first resistor material and the conductive plate is less than a second distance between the first resistor material and the first conductive line.

2. The semiconductor structure as claimed in claim 1, further comprising:
a second resistor material of the resistor layer;
a second conductive line of the second metal layer;
a third conductive line of the second metal layer;
a second via formed between the second conductive line and the second resistor material; and
a third via formed between the third conductive line and the second resistor material,
wherein the second resistor material forms a resistor between the second and third conductive lines.

3. The semiconductor structure as claimed in claim 2, wherein a distance from the second resistor material to the second conductive line or the third conductive line is identical to the second distance between the first resistor material and the first conductive line.

4. The semiconductor structure as claimed in claim 1, further comprising:
a second conductive line of the second metal layer; and
a second via formed between the second conductive line and the conductive plate,
wherein a via height of the first via is less than a via height of the second via.

5. The semiconductor structure as claimed in claim 1, wherein a capacitance of the capacitor is determined according to an overlapping area of the first resistor material and the conductive plate.

6. A semiconductor structure, comprising:
a substrate;
a first metal layer over the substrate;
a second metal layer over the first metal layer;
a resistor between the first and second metal layers, comprising:
a first resistor material of a resistor layer;
a capacitor, comprising:
a first electrode plate formed by a metal plate of the first metal layer;
a high-K material over the first electrode plate; and
a second electrode plate over the high-K material and formed by a second resistor material of the resistor layer; and
a third metal layer over the second metal layer, wherein a distance between the second and third metal layers is less than a distance between the first and second metal layers.

7. The semiconductor structure as claimed in claim 6, wherein a first distance between the first and second electrode plates of the capacitor is less than a second distance between the second electrode plate and the second metal layer.

8. The semiconductor structure as claimed in claim 7, wherein a thickness of the high-K material is identical to the first distance between the first and second electrode plates of the capacitor.

9. The semiconductor structure as claimed in claim 6, wherein a capacitance of the capacitor is determined according to an overlapping area of the first and second electrode plates.

10. The semiconductor structure as claimed in claim 6, wherein a terminal of the resistor is electrically connected to a first metal line of the second metal layer, and another terminal of the resistor is electrically connected to a second metal line of the second metal layer.

11. The semiconductor structure as claimed in claim 6, wherein the first electrode plate of the capacitor is coupled to a first metal line of the second metal layer through a first via, and the second electrode plate of the capacitor is coupled to second metal line of the second metal layer through a second via, and the first via has a higher via height than the second via.

12. The semiconductor structure as claimed in claim 6, wherein the first and second resistor materials are the same material.

13. The semiconductor structure as claimed in claim 6, further comprising:
a fourth metal layer under the first metal layer,
wherein a distance between the fourth and first metal layers is less than the distance between the first and second metal layers.

14. A semiconductor structure, comprising:
a substrate;
a first metal layer over the substrate;
a second metal layer over the first metal layer;
a resistor between the first and second metal layers, comprising:
a first resistor material of a resistor layer; and
a capacitor, comprising:
a first electrode plate formed by a metal plate of the second metal layer;
a high-K material under the first electrode plate; and
a second electrode plate under the high-K material and formed by a second resistor material of the resistor layer.

15. The semiconductor structure as claimed in claim 14, wherein a first distance between the first and second electrode plates of the capacitor is less than a second distance between the second electrode plate and the first metal layer.

16. The semiconductor structure as claimed in claim 15, wherein a thickness of the high-K material is identical to the first distance between the first and second electrode plates of the capacitor.

17. The semiconductor structure as claimed in claim 14, wherein a capacitance of the capacitor is determined according to an overlapping area of the first and second electrode plates.

18. The semiconductor structure as claimed in claim 14, wherein a terminal of the resistor is electrically connected to first metal line of the second metal layer, and another terminal of the resistor is electrically connected to second metal line of the second metal layer.

19. The semiconductor structure as claimed in claim 14, wherein the first and second resistor materials are the same material.

20. The semiconductor structure as claimed in claim 2, wherein the first distance between the first resistor material and the conductive plate is less than a third distance between the second resistor material and the second metal layer.

\* \* \* \* \*